(12) United States Patent
Kajiwara et al.

(10) Patent No.: US 8,303,854 B2
(45) Date of Patent: Nov. 6, 2012

(54) SINTERING SILVER PASTE MATERIAL AND METHOD FOR BONDING SEMICONDUCTOR CHIP

(75) Inventors: Ryoichi Kajiwara, Hitachi (JP); Shigehisa Motowaki, Mito (JP); Yusuke Asaumi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/117,361

(22) Filed: May 27, 2011

(65) Prior Publication Data
US 2011/0290863 A1    Dec. 1, 2011

(30) Foreign Application Priority Data

May 31, 2010 (JP) ................................. 2010-123774

(51) Int. Cl.
*H01B 1/02* (2006.01)
*H01B 1/22* (2006.01)
*B22F 1/02* (2006.01)
(52) U.S. Cl. .................... 252/514; 252/519.2; 75/252
(58) Field of Classification Search .......... 75/252; 252/514, 519.2
See application file for complete search history.

(56) References Cited

U.S. PATENT DOCUMENTS

| | | | | |
|---|---|---|---|---|
| 2005/0194577 A1* | 9/2005 | Kasuga et al. | ................. | 252/514 |
| 2006/0289837 A1* | 12/2006 | McNeilly et al. | ............. | 252/500 |
| 2007/0235695 A1* | 10/2007 | Sato et al. | ...................... | 252/500 |
| 2007/0256783 A1* | 11/2007 | Dietz et al. | ..................... | 156/326 |
| 2009/0096100 A1 | 4/2009 | Kajiwara et al. | | |
| 2010/0065790 A1* | 3/2010 | Dietz et al. | ..................... | 252/514 |
| 2010/0187678 A1 | 7/2010 | Kajiwara et al. | | |

FOREIGN PATENT DOCUMENTS

| | | |
|---|---|---|
| JP | 59-167906 | 9/1984 |
| JP | 2007-95510 | 4/2007 |
| JP | 2008-176951 | 7/2008 |
| JP | 2009-94341 | 4/2009 |
| JP | 2010-171271 | 8/2010 |
| JP | 2011-146591 | 7/2011 |
| WO | WO 2006/126614 A1 | 11/2006 |
| WO | 2008-093913 | * 8/2008 |

OTHER PUBLICATIONS

JP Search Report of Appln. No. 2010-123774 dated Mar. 27, 2012.

* cited by examiner

*Primary Examiner* — George Wyszomierski
*Assistant Examiner* — Ngoclan T Mai
(74) *Attorney, Agent, or Firm* — Antonelli, Terry, Stout & Kraus, LLP.

(57) ABSTRACT

An object of the present invention is to provide a composition of a sintering Ag paste which can metallically bond to a nonprecious metal member with high strength as well as to a precious metal member, in a sintering Ag paste which metallically bonds to a metal at a low temperature, and to provide a bonding method to obtain a joint part having high strength. The sintering Ag paste is a material containing a solution of an organic silver complex that is easily decomposed by heat regardless of an atmosphere. Furthermore, the bonding method includes: metallizing a face of a nonprecious metal with Ag in a non-oxidizing atmosphere in a step prior to sintering Ag particles; and then sintering the Ag particles in an oxidizing atmosphere.

4 Claims, 6 Drawing Sheets

FIG. 2
(1) Supply sintering Ag paste to space between members to be bonded.
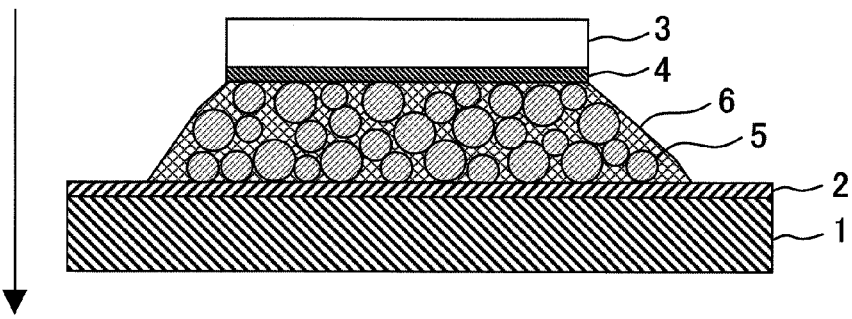
(2) Bake organic silver complex to metallize face of nonprecious metal with Ag.
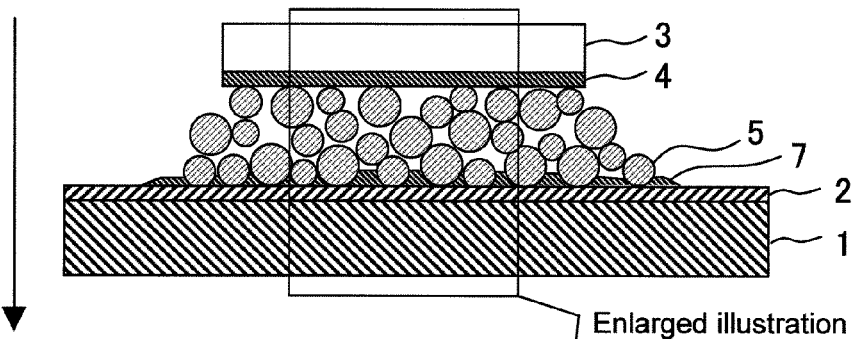
(3) Sinter Ag micro-particles to complete bonding.
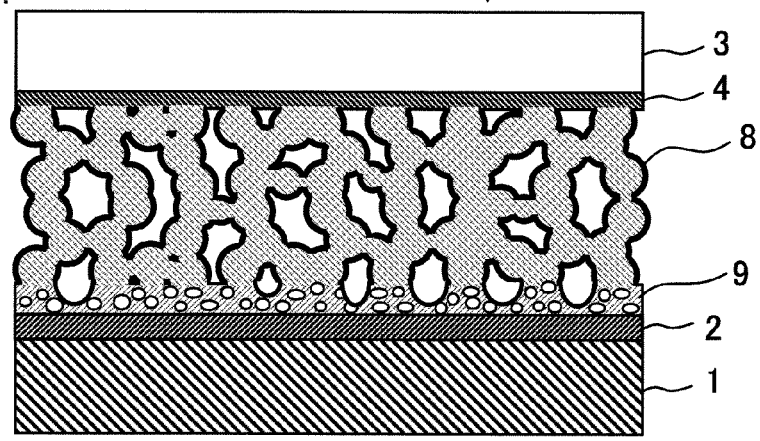
Enlarged illustration

FIG. 3

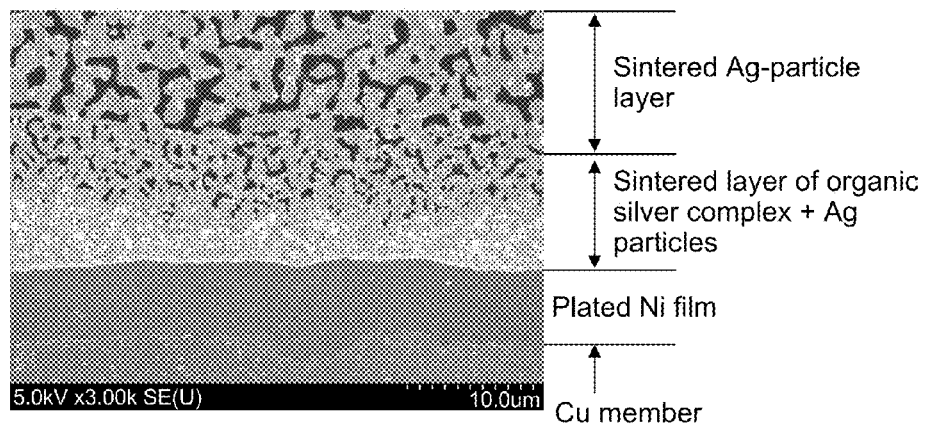

FIG. 4

| | Ag particle 0.1-2.0μm | Electroconductive particle 5-500μm | Solution of organic Ag complex | Organic solvent | Paste function | Bonding strength Ag*1) | Bonding strength Ni*2) | Bonding strength Cu*3) |
|---|---|---|---|---|---|---|---|---|
| 1 | 70 | – | 20 | 10 | × | × | × | × |
| 2 | 75 | – | 15 | 10 | △ | △ | △ | △ |
| 3 | 75 | – | 25 | 0 | △ | △ | △ | △ |
| 4 | 80 | – | 10 | 10 | ○ | ○ | ○ | ○ |
| 5 | 80 | – | 20 | 0 | ○ | ○ | ○ | ○ |
| 6 | 85 | – | 10 | 5 | ○ | ◎ | ◎ | ◎ |
| 7 | 90 | – | 10 | 0 | ◎ | ◎ | ◎ | ◎ |
| 8 | 90 | – | 5 | 5 | ◎ | ◎ | ○ | ○ |
| 9 | 90 | – | 0 | 10 | ◎ | ◎ | × | × |
| 10 | 95 | – | 5 | 0 | × | × | × | × |
| 11 | 90 | 5 | 5 | 0 | × | × | × | × |
| 12 | 85 | 5 | 10 | 0 | ○ | ○ | ○ | ○ |
| 13 | 80 | 10 | 5 | 5 | ○ | ○ | ○ | ○ |
| 14 | 75 | 10 | 10 | 5 | ○ | △ | △ | △ |
| 15 | 70 | 15 | 10 | 5 | ○ | × | × | × |

*(1) bonding process for Ag member: 250°C - 1 h in the atmosphere
*(2) bonding process for Ni member: 400°C in (N2+H2) ⇒ 250°C - 1 h in the atmosphere
*(3) bonding process for Cu member: 400°C in (N2+H2) ⇒ 200°C - 1 h in the atmosphere
  ⇒ 350°C in (N2+H2)

FIG. 5

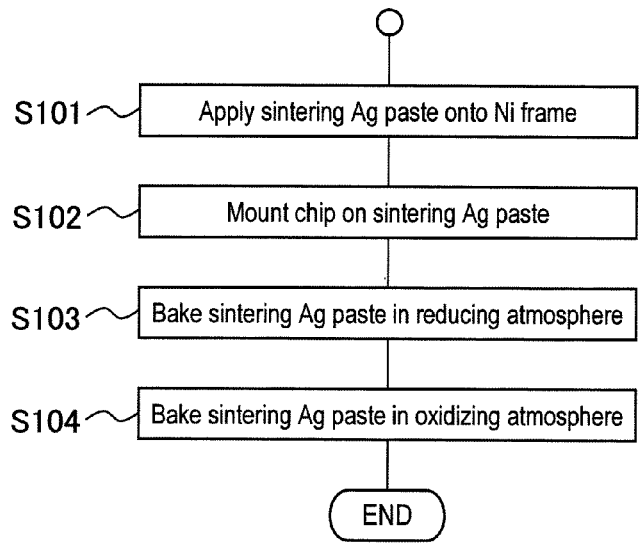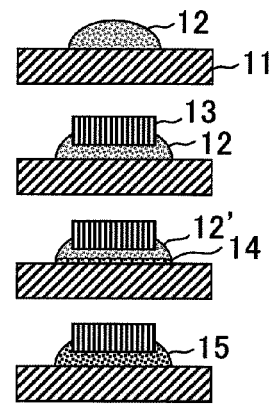

- S101 — Apply sintering Ag paste onto Ni frame
- S102 — Mount chip on sintering Ag paste
- S103 — Bake sintering Ag paste in reducing atmosphere
- S104 — Bake sintering Ag paste in oxidizing atmosphere
- END

FIG. 6

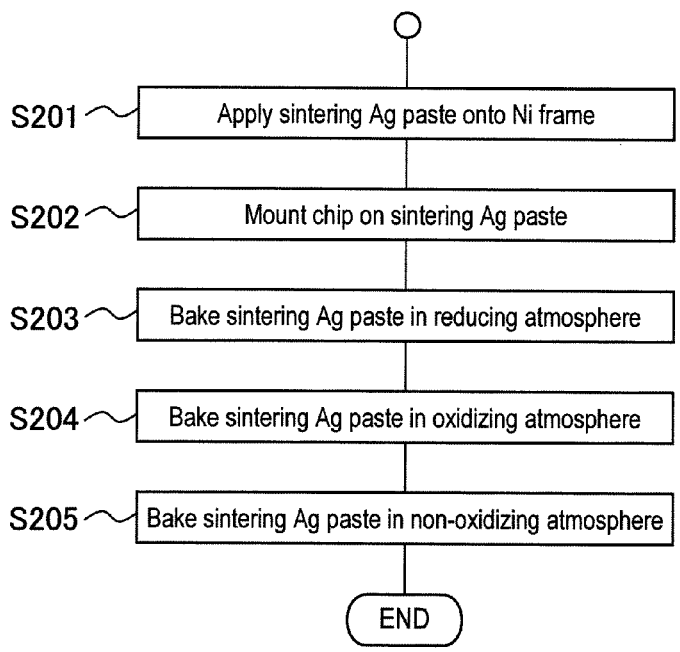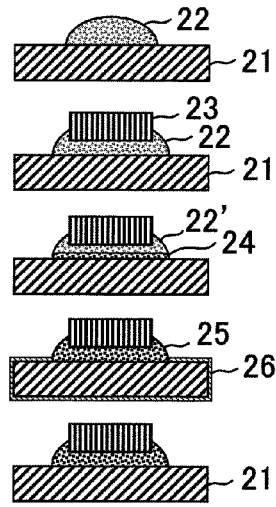

- S201 — Apply sintering Ag paste onto Ni frame
- S202 — Mount chip on sintering Ag paste
- S203 — Bake sintering Ag paste in reducing atmosphere
- S204 — Bake sintering Ag paste in oxidizing atmosphere
- S205 — Bake sintering Ag paste in non-oxidizing atmosphere
- END

SINTERING SILVER PASTE MATERIAL AND METHOD FOR BONDING SEMICONDUCTOR CHIP

BACKGROUND OF THE INVENTION

1. Field of the Invention

The present invention relates to a lead-free bonding material having high heat resistance and a bonding method used in the semiconductor field, and relates, for instance, to a sintering silver paste material for obtaining a joint part with high heat resistance and excellent in thermal and electric conductivity, by strongly bonding to a member of a nonprecious metal such as Cu and Ni in a bonding process at a low temperature of 300° C. or lower and without applying pressurization, and a method for bonding a semiconductor chip by the material.

2. Background Art

The use of a solder containing lead in the electrical and electronics fields has been restricted by the environmental regulations advocated in Europe, and all solders for substrate packaging have been converted to a lead-free solder. However, a high melting-point solder (melting point >260° C.) which is used for bonding a chip of a power system device and has a high lead content is still used because no alternative material has been developed yet. For this reason, it becomes urgently necessary to develop a lead-free connecting material which is resistant to high temperatures.

In the present state, the most dominant candidate of a lead-free connecting material for the alternative high-lead solder includes an electroconductive paste material of a metal bonding type. As for this typical electroconductive paste material, there are known an Ag nano-particle paste in which Ag particles with a nanometric size are dispersed in a solvent (JP Patent Publication (Kokai) No. 2007-095510 A), and an Ag micro-particle paste in which silver particles with a micrometric size and an organic solvent are kneaded into a slurry state (International Publication No. WO 2006/126614).

The Ag nano-particle paste has an organic protective film formed on the surface so as to prevent the cohesion among Ag particles and to secure dispersibility, and is sintered at a low temperature by decomposing and removing the protective film by heating. Because the Ag nano-particle is very active, the Ag nano-particle can be bonded to Cu and Ni with a certain degree of strength if a load is applied to the Ag nano-particle and adhesion is secured, but on the condition in which the load is not applied, the bonding strength becomes very weak. In addition, because large volumetric shrinkage occurs and large voids are locally formed when the paste is sintered, it is necessary to apply a load to the paste in bonding so as to reduce bonding defects.

On the other hand, the Ag micro-particle paste easily progresses its sintering process when heated in the atmosphere (200 to 300° C.) and a bonding strength of 10 MPa or more is easily obtained even without applying the load to the paste. However, a bondable object material is limited to precious metal materials such as Au and Ag, which are not oxidized by heating in the atmosphere of 200 to 300° C., and with respect to Cu and Ni, the strength of merely several MPa or less is obtained by the bond.

Most of metallic members composing a semiconductor are made from Cu which adequately conducts electricity and heat, and the material of a face to be bonded is usually Cu. In addition, the Cu surface of the member at which oxidative degradation by heating becomes a problem is plated with Ni, and the material of the face to be bonded in thus Ni.

The high-lead solder adequately wets Cu and Ni (adequately receptive), and can bond a semiconductor chip to these members without any problem. When the member is bonded by using a highly electroconductive Ag paste of the alternative high-lead solder on the condition of applying no pressure, the metallic member is necessary to be plated with a precious metal, which causes a problem of increasing a member cost.

When a Cu or Ni member is bonded by using the Ag micro-particle paste on the condition of applying no pressure, the member is not bonded to sintered Ag because the surface of the member is oxidized in a heating process, which causes a problem that a necessary strength cannot be obtained.

When the Ag micro-particle paste is heated and baked in a non-oxidizing atmosphere in order to prevent the oxidization of the member, an organic component which deposits on the surface of the Ag micro-particle cannot be decomposed and removed at a temperature of 500° C. or lower, which accordingly causes a problem that the sintering between Ag particles does not progress and the members cannot be bonded.

A first object of the present invention is to provide a sintering type Ag micro-particle paste material which can metallically bond a semiconductor chip to even a member of a nonprecious metal such as Cu and Ni with a strength of 10 MPa or more, under the bonding condition of applying no pressure. A second object of the present invention is to provide a bonding method for bonding a semiconductor chip to Cu or Ni with a strength of 10 MPa or more by using the Ag particle paste under the condition of applying no pressure.

SUMMARY OF THE INVENTION

In order to achieve the first object, an Ag paste has a slurry form and includes: 80 to 90 wt % of Ag particles having an average particle size of 0.1 to 2.0 μm; 5 to 20 wt % of a solution of an organic silver complex such as silver octylate, silver neodecanate and various silver carboxylates; and 0 to 10 wt % of an organic solvent which includes C, H and O, as needed. In addition, the Ag content in the whole liquid composition is set at 30 wt % or more.

By adding the solution of the organic silver complex to the Ag paste, the face to be bonded of a nonprecious metal member shall be covered with the solution containing silver. The chemically unstable organic silver complex is separated into Ag and an organic ligand in a heating process, and the separated Ag floats and migrates in the liquid and deposits on a metal surface which the separated Ag has contacted first. The Ag deposits also on the surface of the nonprecious metal.

When the nonprecious metal member is arranged in the lower side, an amount of Ag to sediment/deposit increases, because the liquid flows to the lower side by its own weight. The back face electrode of a chip in the upper side is already metallized with a precious metal, and accordingly even after all of the organic silver complexes has been decomposed, and the organic ligand in the liquid and the organic solvent have volatilized and dissipated, the nonprecious metal member in the lower side, on which the Ag has sedimented, can be metallically bonded with the back face electrode of the chip in the upper side by a sintering behavior of the Ag particles.

A structure of a sintered silver layer which has been sintered under a condition of applying no pressure becomes a porous structure having many holes therein, but a strength by a value of exceeding 10 MPa can be easily obtained, because silver is metallically bonded to each other while forming a three-dimensional network.

The reason why the content rate of the Ag particle is set at 80 to 90 wt % is because if the content rate is less than 80 wt %, the viscosity of the paste is lowered, the paste tends to easily flow and becomes difficult to form a thick bonded layer, thermal strain increases in a joint part between Si and Cu which have different coefficients of thermal expansion, during a cooling step, and such malfunctions occur that a crack is formed in the bonded layer and the breaking strength decreases due to the high residual stress.

In addition, if the content rate is more than 90 wt %, the viscosity of the paste obtained after the Ag particles have been kneaded with the solution of the organic silver complex becomes too high, and the paste becomes difficult to be supplied to the joint part, or the paste aggravates the flow when a chip has been mounted and does not spread to the joint region. Accordingly, such a content rate cannot be adopted.

The reason why the amount of the solution of the organic silver complex is set at 5 to 20 wt % and the Ag content in the whole liquid is set at 30 wt % or more is because these amounts are the minimum amounts necessary for the Ag separated from the organic silver complex to cover the whole face of faces to be bonded of the nonprecious metal member which has been arranged in the lower side.

As described above, the Ag paste containing the Ag particles and the solution of the organic silver complex has an effect of metallizing with respect to nonprecious metals Ni and Cu, accordingly can secure bondability equal to that for precious metals, and can provide a lead-free semiconductor device using an inexpensive member.

In order to achieve the second object, the heating process has two steps and includes: supplying the Ag paste according to the present invention to a space between a member of Cu or Ni to be bonded and a semiconductor chip, and then heating the Ag paste to a temperature of 300 to 500° C. in a reducing atmosphere to metallize the face of the nonprecious metal member to be bonded with Ag, as the first heating process; and heating the Ag paste to a temperature of 180 to 300° C. in an oxidizing atmosphere to sinter the Ag particles and metallically bond the both members, as the second heating process.

When a Cu member is used, a step of heating to a temperature of 200 to 400° C. in a reducing atmosphere to reduce the oxidized Cu is further added to the above processes as the third heating process.

Firstly, the paste containing the solution of the organic silver complex and Ag micro-particles mixed is supplied to the joint part, the paste is heated to 300 to 500° C. in a reducing atmosphere, thereby the organic silver complex in the paste thermally decomposes, and the Ag component deposits and sediments on the surface of the metallic member in its periphery.

Even if the object material used at this time is an oxidative metal of a nonprecious metal, the surface of the metal is kept active because of being exposed to the reducing atmosphere, and is easily bonded with Ag through a metallic bond to have a firm metallizing Ag film formed thereon. Sintering does not proceed when the Ag particles are heated in a reducing atmosphere, and the Ag particles are in a state of keeping the form of a particle and being still unbonded.

Next, the paste is heated to 180 to 300° C. in an oxidizing atmosphere, thereby the organic protection film on the surface of the Ag particle is oxidized and decomposed to be removed, fusion proceeds between the Ag particles, between the Ag particles and the precious metal electrode on the back face of the chip, and between the Ag particles and the oxidative metallic member having the metallizing Ag film formed thereon, and the metallic bonds are attained. When an Ni member is used, oxidization does not almost proceed thereon at 300° C. or lower, and deterioration by oxidization does not occur on the metallic member in a region which is not metallized with Ag.

However, when a Cu member is used, oxidization proceeds in a region in which Cu is exposed to the atmosphere and the color changes into blackish brown. Because of this, after the Ag particles have been sintered and bonding has been completed, the member is further heated in a reducing atmosphere as needed, and the oxidized Cu is reduced. Then, the bonding step is finished.

As described above, it becomes possible to attain bonding with a bonding strength of 10 MPa or more which is equal to that for the precious metal even to the nonprecious metal member under the bonding condition of applying no pressure, by adopting the two-step heating process in the case of a metal such as Ni which is excellent in oxidation resistance in the temperature range of 300° C. or lower, and by adopting a three-step heating process in the case of a metal such as Cu on which oxidization proceeds in the temperature range of 180° C. or higher.

In the present invention, the Ag paste material includes 80 to 90 wt % of Ag particles having an average particle size of 0.1 to 2.0 μm, 5 to 20 wt % of a solution of an organic silver complex, and 0 to 10 wt % of an organic solvent with a high boiling point; and thereby it becomes possible even for the member of a nonprecious metal material to be bonded to be metallically bonded similarly to the precious metal member, by an action of forming a metallizing Ag film of the solution of the organic silver complex.

In addition, the bonding process is the two-step heating process which includes a heating process in a reducing atmosphere and a heating process in an oxidizing atmosphere; and thereby it becomes possible to set an adhesion strength between the nonprecious metal member and the metallizing Ag film and a sinter-bonding strength between the Ag particles, at a high strength of 10 MPa or more, and to sinter-bond a chip to the nonprecious metal member similarly to the case of the precious metal.

BRIEF DESCRIPTION OF THE DRAWINGS

FIG. 2 is a view illustrating a process of bonding by the sintering Ag paste according to the present invention.

FIG. 3 is one example of a cross section of a part jointed by the sintering Ag paste according to the present invention.

FIG. 4 shows examples showing characteristics of the sintering Ag pastes of a conventional one and of the present invention.

FIG. 5 is one example illustrating a method for bonding an Ni member according to the present invention.

FIG. 6 is one example illustrating a method for bonding a Cu member according to the present invention.

DESCRIPTION OF SYMBOLS

Figure 1:
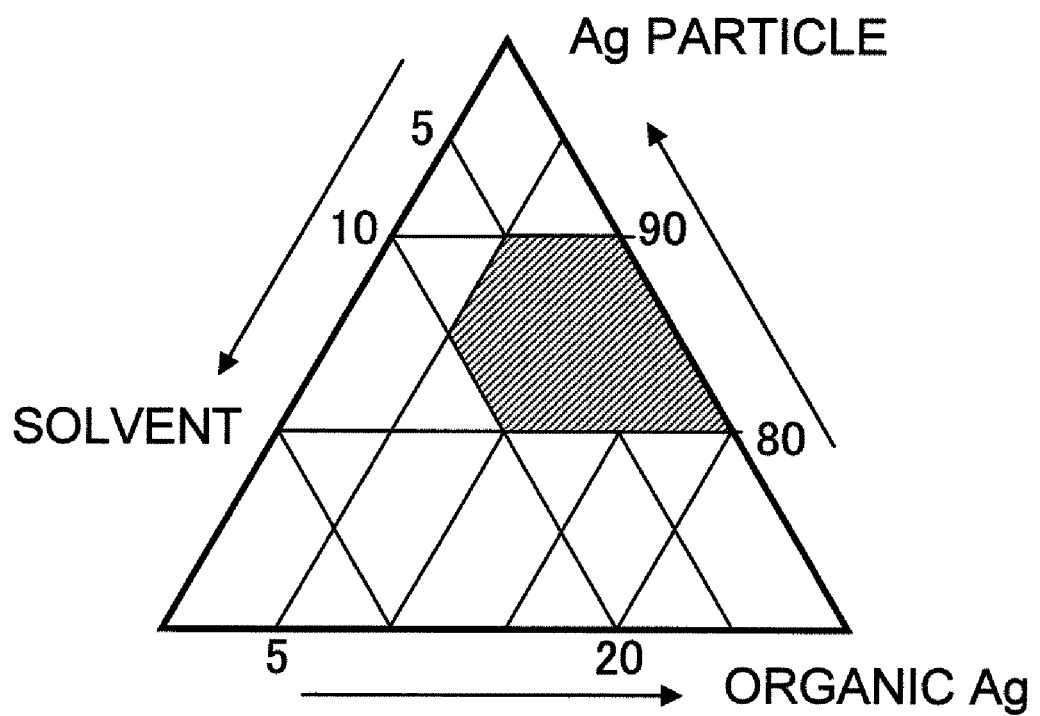
FIG. 1 is one example illustrating a composition range of the sintering Ag paste according to the present invention.

1 Cu member
2 Plated Ni film
3 Semiconductor chip
4 Vapor-deposited Au film

5 Ag micro-particle
6 Solution of organic silver complex
7 Metallizing Ag film
8, 9 Sintered Ag layer
11 Ni-plated frame
12, 22 Sintering Ag paste
13, 23 Transistor chip
14, 24 Sintered Ag film
15, 25 Sintered Ag layer
21 Cu frame
26 Cu oxide film

DETAILED DESCRIPTION OF THE PREFERRED EMBODIMENTS

Examples according to the present invention will be described below in detail with reference to the drawings.

FIG. 1 illustrates a ternary composition diagram of an Ag micro-particle, a solution of an organic silver complex and an organic solvent, in the sintering Ag paste material according to the present invention.

The Ag micro-particles are approximately spherical, and are powder having such sizes that the average particle size is in the range of 0.1 to 2.0 µm and the maximum particle size does not exceed 10 µm, and are an Ag powder which is generally on the market and is manufactured by a reduction method. The average particle size of the Ag micro-particles is calculated by taking a photograph of a group of the silver particles in the paste with a scanning electron microscope (SEM) having a magnification of 10,000 to 50,000 times, limiting an area in the taken SEM image, and measuring diameters of silver particles of which the surfaces are fully viewed. The size of the area is determined so that the number of measurable silver particles is 50 or more.

The solution of the organic silver complex is a solution containing various fatty acid silver salts such as silver neodecanate, silver oleate, silver linoleate, silver caprylate, silver caprate, silver myristate, silver 2-methyl propanoate, silver 2-methyl butanoate, silver 2-ethyl butanoate and silver 2-ethyl hexanoate dissolved in an organic solvent having a boiling point of 150° C. or higher. The organic solvent is solvents having a boiling point of 150° C. or higher, such as diethylene glycol monobutyl ether, methyl ethyl ketone, isophorone and terpineol. The Ag paste material has a composition in which the content of the Ag micro-particle is selected from the range of 80 to 90 wt %, the content of the solution of the organic silver complex is selected from the range of 5 to 20 wt % and the content of the organic solvent is selected from the range of 0 to 10 wt %.

FIG. 2 schematically illustrates bonding processes to be conducted when a semiconductor chip is bonded to an Ni-plated member by using the sintering Ag paste having the composition illustrated in FIG. 1.

In FIG. 2, a plated Ni film 2 is formed on the surface of a Cu member 1, and a vapor-deposited Au film 4 is formed on the outermost surface of a back face electrode of a semiconductor chip 3. In FIG. 2(1), the sintering Ag paste containing a solution 6 of the organic silver complex in an organic solvent and Ag micro-particles 5 is supplied between the members to be bonded.

In FIG. 2(2), the sintering Ag paste is heated to 400° C. in a non-oxidizing atmosphere, and makes metal Ag precipitate from the solution of the organic silver complex in the sintering Ag paste and sediment on a plated Ni face to form a metallizing Ag film 7 on the face. At this time, the organic solvent and the organic component which has been the organic silver complex and has been separated from Ag are volatilized and dissipated.

In FIG. 2(3), the sintering Ag paste is heated to 250° C. in an oxidizing atmosphere, which makes a residual organic component of the organic silver complex and an organic protection film which has been adsorbed by the surface of the Ag micro-particles decomposed and removed through oxidization, and promotes a sintering behavior of the Ag particles to metallically bond the upper and lower members to each other through porous sintered Ag layers 8 and 9.

FIG. 3 is a sectional view illustrating a bonded structure of an Ni-plated member side. The structure is formed, in which the sintered Ag layer in contact with a plated Ni film is a layer formed from Ag which has precipitated from the solution of the organic silver complex and has sedimented on the plated Ni film (sintered layer of organic silver complex+Ag particles), accordingly has no large hole therein and forms a relatively dense Ag layer though having fine voids, and the layer on the above described layer is a layer formed from sintered Ag micro-particles (sintered Ag-particle layer), accordingly has holes remaining therein which have been cavities among the particles and forms an Ag layer having high porosity.

In the present example, the solution of the organic silver complex is added to the sintering Ag paste, and accordingly even though the member to be bonded is a nonprecious metal material, an active Ag which has precipitated from the organic silver complex in the previous step of the heating process metallically bonds to a nonprecious metal and covers the surface. Accordingly, in the subsequent step of sintering the Ag micro-particle, a back face Au electrode of a semiconductor chip and a nonprecious metal member having a bonded face metallized with Ag can be strongly bonded through a sintered silver layer. In other words, if the sintering Ag paste according to the present invention is used, an inexpensive nonprecious metallic member can be strongly bonded similarly to a metallic member metallized with a precious metal.

FIG. 4 shows the results of evaluating: paste supply properties of prototyped materials of sintered Ag pastes in which the formation and the composition are changed; a paste function concerning the shape-keeping properties after the paste has been supplied; and bonding strength with respect to each bonded member of Ag, Ni and Cu.

As for the bonding process, when Ag is used for the member, the member is subjected only to heating treatment in the atmosphere at 250° C. for 1 h (1 hour). When Ni is used for the member, the member is subjected to a two-step treatment which includes the first heating treatment in a reducing atmosphere of (N2+H2) at 400° C. for 10 minutes and subsequent heating treatment in the atmosphere at 250° C. for 1 hour. When Cu is used for the member, the member is subjected to a three-step treatment which includes the first heating treatment in a reducing atmosphere of (N2+H2) at 400° C. for 10 minutes, the subsequent heating treatment in the atmosphere at 250° C. for 1 hour, and final heating treatment in a reducing atmosphere of (N2+H2) at 350° C. for 30 minutes.

In FIG. 4, Ag paste No. 9 which does not contain a solution of an organic silver complex is superior in the paste function and the bondability to Ag, but is inferior in bondabilities to Ni and Cu of nonprecious metals. Ag pastes Nos. 1, 2 and 3 which contain Ag particles in an amount of 75 wt % or less contain a liquid at a high proportion, accordingly have low viscosities, result in difficulty in forming a thick bonding layer, generate large residual stress when a semiconductor chip and a Cu-based metallic member are bonded which have a large difference of thermal expansion, and cause a problem that breaking strength becomes relatively low.

In addition, Ag paste No. 10 which contains the Ag particle in an amount of 95 wt % has excessively high viscosity, causes problems that supply properties appearing when the Ag paste is supplied by a dispenser or the like are lowered and adhesiveness between the Ag paste and a semiconductor chip shown when the chip has been mounted is lowered, and as a result, causes a problem that bonding strength is also lowered.

Ag pastes Nos. 4 to 8 which contain the Ag particle in an amount of 80 to 90 wt % and the solution of the organic silver complex in an amount of 5 to 20 wt % provide satisfactory results in the paste function and bonding strengths with respect to an Ag member and to Ni and Cu members of nonprecious metals.

In Ag pastes Nos. 11 to 15 in which electroconductive particles of such as AgCu, Al, Mg, Ni, Mo and W having particle sizes of 5 to 500 μm are added to the sintering Ag paste, No. 11 which contains 95 wt % in total of the Ag particle and the electroconductive particle shows excessively high viscosity and becomes inferior in both of the paste function and the bonding strength.

Ag pastes Nos. 14 and 15 which include the Ag particle in an amount of 75 wt % or less show an adequate paste function because the total amount of the metal particle is 85 wt %, but cause a problem that the bonding strength is slightly lowered because the amount of the Ag particle is insufficient which obtains the metallic bond. Furthermore, Ag pastes Nos. 12 and 13 which include metal particles in a total amount of 90 wt % provide satisfactory results in the paste function and the bonding strength.

In the present example, any type of metallic members can be bonded by the same paste by using the sintering Ag pastes Nos. 4 to 8, accordingly only one type of Ag paste can be used for bonding materials, a material-changing operation in an assembly process becomes unnecessary, and various types of members can be produced in the same production line, which is useful for enhancing the productivity.

In addition, by using sintering Ag pastes Nos. 12 and 13 in which electroconductive particles with a large particle size are added, control for the thickness and gradient of the bonding layer becomes easy and bonding with a stable bonding quality becomes possible. There is also such effects that when a Cu particle is used as the electroconductive particle, a cost of the paste can be reduced, and that when a particle in which Al is plated with Ni/Au is used, the paste becomes lighter and the joint part can be provided which has an excellent performance of absorbing the strain due to the soft properties of Al.

Incidentally, FIG. 4 shows the case in which a metallic particle excellent in electroconductivity is used as an electroconductive particle with a large diameter, but an electroconductive particle may be employed which has a core of heat-resistant resin coated with a metal so that the weight content rate becomes lower than but the volume content rate is almost equal to the case of the metallic particle.

FIG. 5 is a view illustrating a bonding procedure and a sectional state of a joint part in the case in which a Cu lead frame plated with Ni is die-bonded to a transistor chip. In FIG. 5, a predetermined amount of the sintering Ag paste 12 is supplied to a die pad region of a frame 11 plated with Ni, from a dispenser (step S101). The sintering Ag paste 12 has a composition in which an Ag micro-particle with a size of 0.1 to 2.0 μm accounts for 90 wt %, an organic silver complex 8 wt % and an organic solvent 2 wt %. The paste 12 is supplied from the dispenser and applied to multiple points according to a chip size. This is conducted so that the paste 12 having relatively high viscosity and low fluidity can be uniformly supplied to the lower part of a chip 13 at high filling density.

The mounting of the transistor chip 13 is conducted by gently pressing the paste while scrubbing lightly, and pushing down the transistor chip 13 to a fixed height from the die pad face while keeping the height horizontal, and is finished above (step S102). After the chip has been mounted, the paste is heated to 300 to 500° C. in a heating furnace having a reducing atmosphere, in such a free state that any load is not applied to the chip 13, then an organic silver complex is thermally decomposed (step S103), and the plated Ni face in a paste-supplied region is coated with a sintered Ag film 14. The heating period of time is approximately 10 to 30 minutes though depending on the temperature.

After that, the Cu lead frame is transferred to the furnace having the atmosphere and heated to a temperature of 180 to 300° C., then the Ag particle in an unsintered state is sintered (step S104), and the transistor chip 13 which has a precious metal electrode formed on the back face is metallically die-bonded to the Ni-plated frame 11 through a sintered Ag layer 15.

In the present example, the transistor chip 13 can be die-bonded to the Ni-plated lead frame 11 with the use of a lead-free connecting material, and accordingly it becomes possible to inexpensively assemble a lead-free transistor package.

FIG. 6 illustrates a bonding procedure and a sectional state of a joint part in the case in which a Cu lead frame free from plating is die-bonded to a transistor chip. In FIG. 6, a predetermined amount of a sintering Ag paste 22 is supplied to a die pad region of a Cu frame 21, from a dispenser (step S201).

The sintering Ag paste 22 has a composition in which an Ag micro-particle with a size of 0.1 to 2.0 μm accounts for 90 wt %, an organic silver complex 8 wt %, and an organic solvent 2 wt %. The paste 22 is supplied from the dispenser and applied to multiple points according to a chip size. The mounting of the transistor chip 23 is conducted by pressing the paste while scrubbing lightly, and pushing down the transistor chip 23 so that the height from the die pad face becomes a fixed height, while keeping the height horizontal, and is finished above (step S202).

After the chip has been mounted, the paste is heated to 300 to 500° C. in a heating furnace having a reducing atmosphere, in such a free state that any load is not applied to the chip 23 (step S203), then an organic silver complex is thermally decomposed, and the Cu face in a paste-supplied region is coated with a sintered Ag film 24.

After that, the Cu lead frame is transferred to a furnace having the atmosphere and heated to a temperature of 180 to 250° C., the Ag particle in an unsintered state is sintered (step S204), and the transistor chip 23 which has a precious metal electrode formed on the back face is metallically die-bonded to the Cu frame 21 through a sintered Ag layer 25. After that, the Cu lead frame is further transferred to a furnace having a reducing atmosphere and is heated to 250 to 350° C. (step S205), and a Cu oxide film 26 on the Cu surface is reduced.

In the present example, the transistor chip 23 can be die-bonded to the Cu lead frame 21 using a lead-free connecting material, and accordingly it becomes possible to inexpensively assemble a lead-free transistor package.

Figure 7:
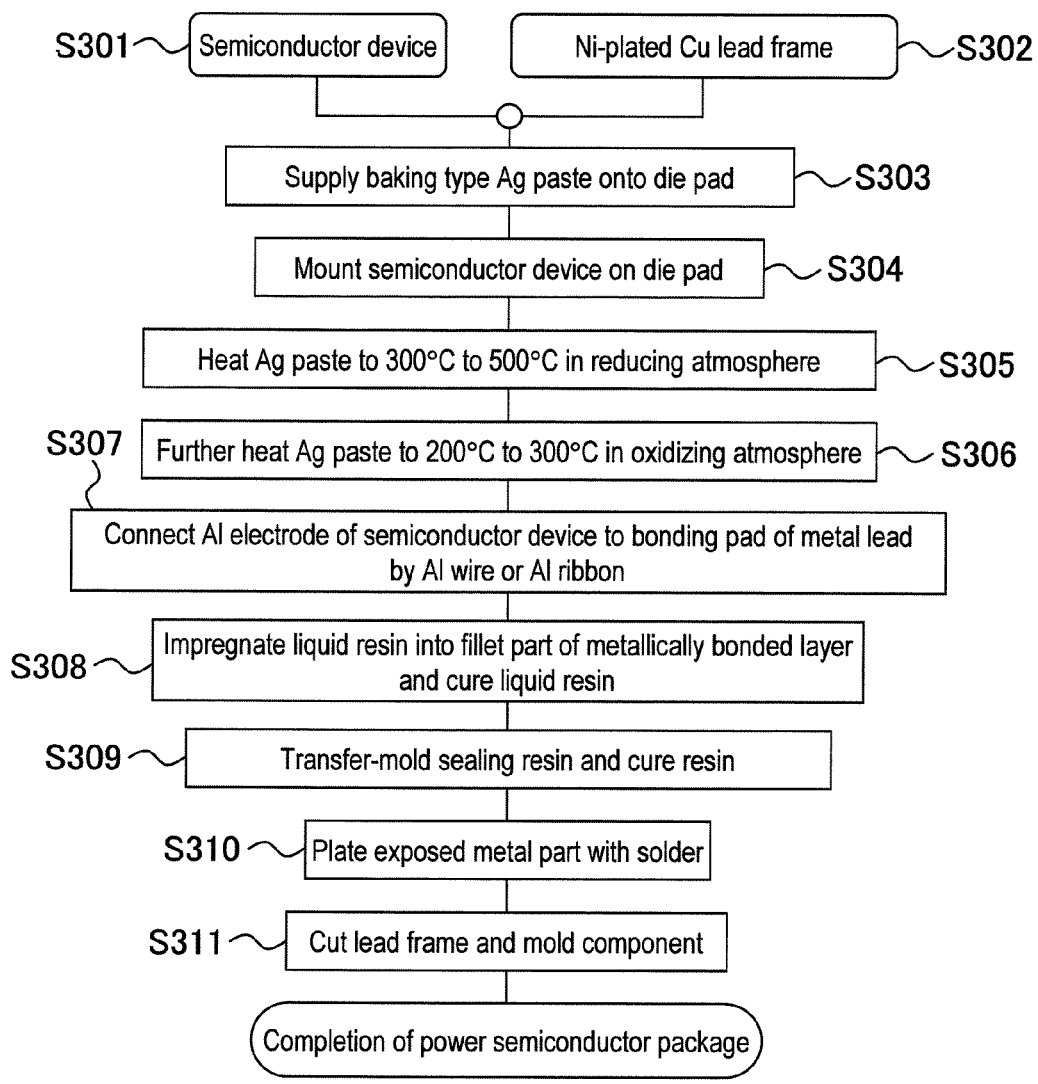
FIG. 7 is an example illustrating a method of assembling a power semiconductor package according to the present invention.

FIG. 7 illustrates an assembling procedure of assembling a power semiconductor package of an Ni-plated lead frame using a sintering Ag paste according to the present invention. In FIG. 7, a semiconductor device of which the back face electrode is metallized with Ag or Au and an Ni-plated Cu lead frame at least of which the upper and lower faces are plated with Ni are prepared (step S301 and S302).

Then, a sintering Ag paste which includes an Ag microparticle, a solution of an organic silver complex, an electroconductive Cu particle plated with Ag and an organic solvent is supplied onto a die pad of the Ni-plated Cu lead frame, and the paste is uniformly distributed under the chip while the chip is pressed (step S303).

The amount of the paste shall be such an amount that the height of the chip to be mounted becomes 150 to 200 μm. After the chip has been mounted (step S304), the lead frame is transported to a furnace having a reducing atmosphere of a mixture of nitrogen and hydrogen, and is baked at a temperature of 300 to 500° C. for approximately 5 to 30 minutes (step S305).

After that, the lead frame is transferred to a heating furnace having the atmosphere therein, and is sintered at a temperature of 200 to 300° C. for 10 to 100 minutes (step S306). After the die-bonding operation has been finished, an Al electrode for control and an Al electrode for a main current on a front side of a semiconductor device, and metal leads for external extraction are connected to each other through an Al wire or an Al ribbon by ultrasonic bonding (step S307).

Next, a thermosetting type of a liquid resin is applied to one or two sides of a fillet on a part jointed by sintered Ag, and is heated to and kept at a temperature of 40 to 80° C., and the liquid resin having lowered viscosity is impregnated into a porous sintered Ag layer by a capillary phenomenon. After that, the liquid resin is heated to a temperature of 180 to 230° C. and is cured or semi-cured (step S308).

Then, a thermosetting type of a sealing resin is transfer-molded so that the metal lead for the external extraction of the lead frame and a back face of a die pad are exposed, and is heated and cured (step S309). The metal part exposed from the resin is subjected to a pretreatment of chemical cleaning and is plated with solder (step S310), finally the lead is cut and molded (step S311), and the power semiconductor package is completed.

Figure 8:
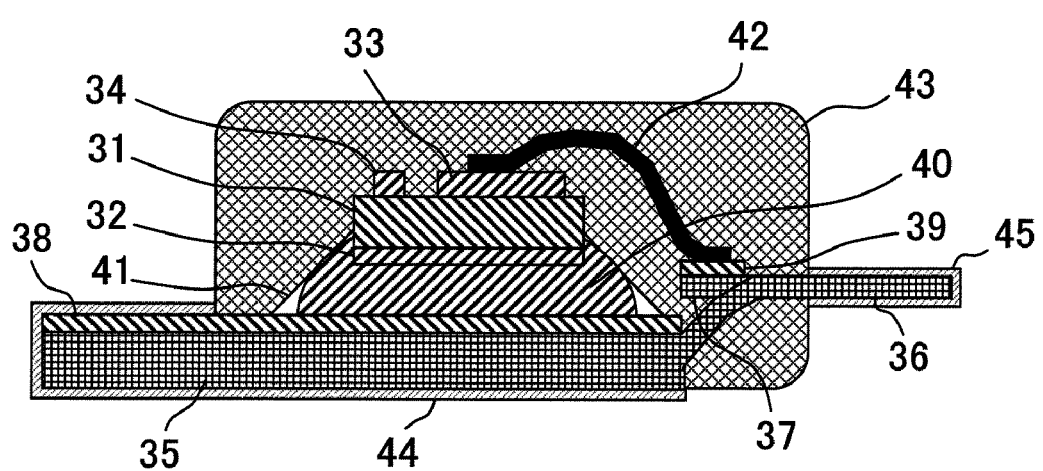
FIG. 8 is one example illustrating a cross-sectional structure of the power semiconductor package according to the present invention.

FIG. 8 illustrates an example of a cross-sectional structure of an assembled power semiconductor package. In the figure, a back face electrode 32 of which the outermost surface is constituted by a precious metal is formed on the back face of an Si chip 31 of the semiconductor device, and a main electrode 33 and a control electrode 34 which are constituted by an Al film are formed on a circuit face.

On a die pad 35 of a lead frame provided with a plated Ni film 38 thereon, the Si chip 31 is metallically die-bonded through a porous sintered Ag layer 40. The sintered layer 40 has a thickness of 150 μm and a cavity ratio of 40%; and a resin 41 which does not contain a filler is filled in many regions of cavity portions in the sintered layer 40 and is formed around the fillet.

An Al wire 42 bonds and connects the main electrode 33 on the Si chip 31 to the metal lead 37 for the main electrode for the external extraction, and bonds and connects the control electrode 34 to a metal lead for the control electrode. The Si chip 31, the Al wire 42, the die-bonded part and one part of the lead frame are sealed by an epoxy resin 43 which contains a filler; and an exposed metal part is plated with an Sn-based lead-free solder alloy 44 and 45.

The present example is constituted so that the power semiconductor package is die-bonded with the sintered Ag containing no lead, and that the exposed metal part is also plated with a low melting point alloy containing no lead, and accordingly there can be provided a semiconductor package which does not contain a substance harmful to the environment.

In addition, the sintered Ag layer for die-bonding is thickened to be a thickness of 150 μm and is further reinforced by the impregnation and curing treatment of the resin, and accordingly the reliability for a temperature cycle of the die-bonded part is greatly enhanced; and the die-bonded part is metallically bonded by Ag, accordingly becomes a connection part excellent in thermal conductivity and electrical conductivity, and can provide a semiconductor package which causes little loss and has high reliability.

In the present invention, the solution of the organic silver complex in the sintering Ag paste covers the face of the nonprecious metal in the region to which the paste is applied, and the whole face of the nonprecious metal to be bonded can be uniformly coated with Ag. When the process is conducted in a non-oxidizing atmosphere, a strong film is formed because a metal atom of the clean nonprecious metal and an Ag atom can be metallically bonded; and when the Ag particles are sintered in an oxidizing atmosphere, the Ag film which is not oxidized and the sintered Ag are metallically bonded, and accordingly the Ag paste can be strongly bonded with respect to the nonprecious metallic member.

What is claimed is:

1. A sintering silver paste material comprising silver particles having an average particle size of 0.1 to 2.0 μm and an organic silver complex solution kneaded together into a slurry state, wherein the organic silver complex solution is a solution containing a liquid fatty acid silver salt compound or a solid fatty acid silver salt dissolved in an organic solvent having a boiling point of 150 ° C. or higher and comprising C, H and O, and a silver content in the organic silver complex solution is 30 wt % or more.

2. The sintering silver paste material according to claim 1, wherein the paste material comprises 80 to 90 wt % of the silver particles; 5 to 20 wt % of the organic silver complex solution.

3. The sintering silver paste material according to claim 2, wherein the paste material further comprises at least one kind of metallic particles selected from the group consisting of Ag, Cu, Al, Mg, Ni, Mo and W, having an average particle size of 5 to 500 μm.

4. The sintering silver paste material according to claim 2, wherein the paste material further comprises particles having resin as a core, the surface of which is coated with a metal including at least one metal selected from the group consisting of Ag, Cu, Al, Mg, Ni, Mo and W.

\* \* \* \* \*